United States Patent
Bahl et al.

(10) Patent No.: US 8,946,780 B2
(45) Date of Patent: Feb. 3, 2015

(54) OHMIC CONTACT SCHEMES FOR GROUP III-V DEVICES HAVING A TWO-DIMENSIONAL ELECTRON GAS LAYER

(75) Inventors: Sandeep R. Bahl, Palo Alto, CA (US); Richard W. Foote, Jr., Burleson, TX (US)

(73) Assignee: National Semiconductor Corporation, Santa Clara, CA (US)

(*) Notice: Subject to any disclaimer, the term of this patent is extended or adjusted under 35 U.S.C. 154(b) by 518 days.

(21) Appl. No.: 13/037,974

(22) Filed: Mar. 1, 2011

(65) Prior Publication Data

US 2012/0223317 A1  Sep. 6, 2012

(51) Int. Cl.
| | |
|---|---|
| H01L 21/285 | (2006.01) |
| H01L 21/02 | (2006.01) |
| H01L 29/45 | (2006.01) |
| H01L 29/778 | (2006.01) |
| H01L 29/417 | (2006.01) |
| H01L 29/66 | (2006.01) |
| H01L 29/20 | (2006.01) |

(52) U.S. Cl.
CPC ........ *H01L 29/7787* (2013.01); *H01L 29/4175* (2013.01); *H01L 29/41758* (2013.01); *H01L 29/66462* (2013.01); *H01L 21/28587* (2013.01); *H01L 29/2003* (2013.01)
USPC ........... 257/200; 257/201; 257/743; 257/744; 257/E21.172; 257/E29.144

(58) Field of Classification Search
USPC .......... 438/317; 257/E29.127, E29.249, 396, 257/E21.407, E29.104, E29.119, E29.253
See application file for complete search history.

(56) References Cited

U.S. PATENT DOCUMENTS

| | | | |
|---|---|---|---|
| 2002/0146856 A1 | 10/2002 | Morita | |
| 2003/0157776 A1* | 8/2003 | Smith | 438/317 |
| 2006/0131654 A1* | 6/2006 | Poulton | 257/355 |
| 2007/0132037 A1* | 6/2007 | Hoshi et al. | 257/396 |
| 2007/0210329 A1* | 9/2007 | Goto | 257/147 |
| 2007/0228418 A1 | 10/2007 | Herman | |
| 2011/0140173 A1 | 6/2011 | Ramdani | |

OTHER PUBLICATIONS

P.R. Hageman, et al., "n-type doping of wurtzite GaN with germanium grown with plasma-assisted molecular beam epitaxy", Journal of Crystal Growth 267 (2004), p. 123-128.

(Continued)

*Primary Examiner* — Telly Green
*Assistant Examiner* — Tsz Chiu
(74) *Attorney, Agent, or Firm* — Steven A. Shaw; Frederick J. Telecky, Jr.

(57) ABSTRACT

A semiconductor device includes a first layer and a second layer over the first layer. The first and second layers are configured to form an electron gas layer at an interface of the first and second layers. The semiconductor device also includes an Ohmic contact and multiple conductive vias through the second layer. The conductive vias are configured to electrically couple the Ohmic contact to the electron gas layer. The conductive vias could have substantially vertical sidewalls or substantially sloped sidewalls, or the conductive vias could form a nano-textured surface on the Ohmic contact. The first layer could include Group III-nitride nucleation, buffer, and channel layers, and the second layer could include a Group III-nitride barrier layer.

12 Claims, 7 Drawing Sheets

(56) References Cited

OTHER PUBLICATIONS

Yoshitaka Nakano, et al., "N-type implantation doping of GaN", Materials Science in Semiconductor Processing 6 (2003), p. 515-517.

Alexei Vertiatchikh, et al., "Structural properties of alloyed Ti/Al/Ti/Au and Ti/Al/Mo/Au ohmic contacts to AlGaN/GaN", Solid-State Electronics 50 (2006), p. 1425-1429.

Michael L. Schuette, et al., "Electrical transport in the copper germanide-n-GaN system: Experiment and numerical model", Journal of Applied Physics 101, 2007, 6 pages.

Jinwook Burm, et al., "Ultra-low resistive ohmic contacts on n-GaN using Si implantation", Appl. Phys. Lett. 70 (4), Jan. 27, 1997, p. 464-466.

F. Iucolano, et al., "Temperature dependence of the specific resistance in Ti/Al/Ni/Au contacts on n-type GaN", Journal of Applied Physics 100, Dec. 26, 2006, 8 pages.

Liang Wang, et al., "Direct contact mechanism of Ohmic metallization to AlGaN/GaN heterostructures via Ohmic area recess etching", Applied Physics Letters 95, Oct. 29, 2009, 3 pages.

S. Arulkumaran, et al., "Low Specific On-Resistance AlGaN/AlN/GaN High Electron Mobility Transistors on High Resistivity Silicon Substrate", Electrochemical and Solid-State Letters, 13 (5), Mar. 12, 2010, p. H169-H172.

* cited by examiner

OHMIC CONTACT SCHEMES FOR GROUP III-V DEVICES HAVING A TWO-DIMENSIONAL ELECTRON GAS LAYER

TECHNICAL FIELD

This disclosure is generally directed to discrete semiconductor devices and integrated circuits. More specifically, this disclosure is directed to Ohmic contact schemes for Group III-V devices having a two-dimensional electron gas layer.

BACKGROUND

Group III-V semiconductor devices are commonly used in high-speed, low-noise, and power applications. A Group III-V device refers to a semiconductor device formed using a compound having at least one Group III element and at least one Group V element. For example, gallium arsenide (GaAs) has been used in pseudomorphic high electron mobility transistors (pHEMTs). A Group III-V semiconductor device could be formed using one or multiple Group III-V compounds.

One specific "family" of Group III-V compounds includes gallium nitride (GaN) and other Group III-nitrides, referring to compounds having at least one Group III element and nitrogen. Group III-nitrides can be used in manufacturing high-speed and high-power discrete devices or integrated circuits. Gallium nitride is often desirable because it can withstand high operating temperatures and can provide high breakdown voltages compared to standard silicon devices. Gallium nitride can also typically provide good high-frequency performance and lower on resistances.

In various Group III-V devices (such as Group III-arsenide and Group III-phosphide devices), a two-dimensional electron gas (2DEG) layer forms at the interface of a barrier layer and a channel layer due to doping in the barrier layer. In other Group III-V devices (such as Group III-nitride devices), a two-dimensional electron gas layer can form as a result of polarization charges within crystallized materials. A two-dimensional electron gas layer typically represents a sheet of electrons where electrons are confined and can move freely within two dimensions but are limited in movement in a third dimension. In a conventional Group III-nitride device, for example, a two-dimensional electron gas layer may form at the interface of two different Group III-nitride layers.

Ideally, an electrical connection can be made through one or more of the layers to an electron gas layer. Conventional approaches for forming an electrical contact to an electron gas layer include etching one of the layers to form a recess for the electrical contact or doping one of the layers, such as by using a silicon or other implantation or through annealing and alloying of a deposited metal layer. However, each of these conventional approaches typically suffers from various drawbacks.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 7, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
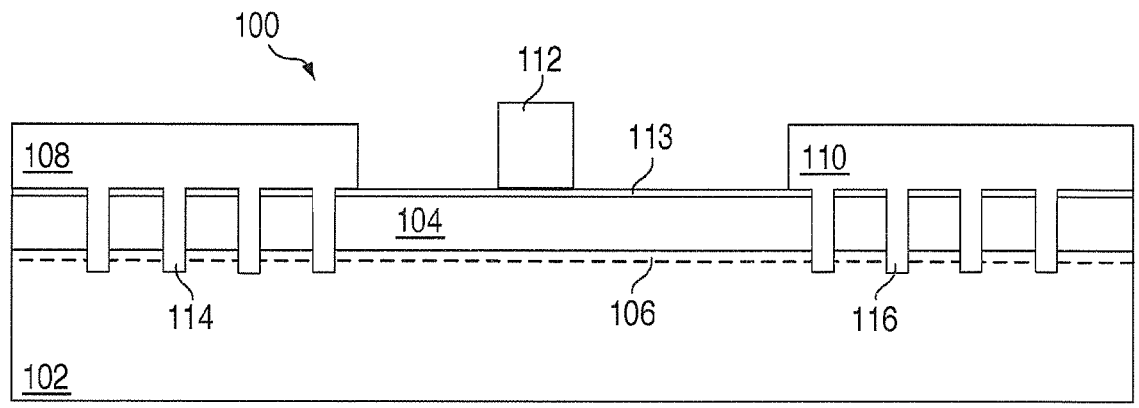
FIG. 1 illustrates a first example Ohmic contact scheme for a Group III-V device having a two-dimensional electron gas layer according to this disclosure.

FIG. 1 illustrates a first example Ohmic contact scheme 100 for a Group III-V device having a two-dimensional electron gas layer according to this disclosure. As shown in FIG. 1, the Ohmic contact scheme 100 is implemented using a structure that includes at least one lower layer 102 and at least one upper layer 104. The layers 102-104 denote layers of material that create a two-dimensional electron gas (2DEG) layer 106 at the interface of the layers 102-104.

Each of the layers 102-104 could be formed from any suitable material(s). For instance, each of the layers 102-104 could be formed from one or more Group III-nitride materials or other Group III-V materials. Example Group III elements include indium, gallium, and aluminum. Example Group V elements include nitrogen, arsenic, and phosphorus. Example Group III-nitrides include gallium nitride (GaN), aluminum gallium nitride (AlGaN), indium aluminum nitride (InAlN), indium aluminum gallium nitride (InAlGaN), aluminum nitride (AlN), indium nitride (InN), and indium gallium nitride (InGaN). Other example Group III-V materials include Group III-arsenide and Group III-phosphide materials, such as gallium arsenide (GaAs). In particular embodiments, the lower layer 102 includes an aluminum nitride nucleation layer, an aluminum gallium nitride buffer layer, and a gallium nitride channel layer, and the upper layer 104 represents an aluminum gallium nitride barrier layer.

Each of the layers 102-104 could also be formed in any suitable manner. For example, the layers 102-104 could represent Group III-V epitaxial layers grown using a metal-organic chemical vapor deposition (MOCVD) or Molecular Beam Epitaxy (MBE) technique. Moreover, each layer 102-104 could represent a single layer of material or multiple layers of the same of different material. In addition, each of the layers 102-104 could have any suitable thickness. For instance, the upper layer 104 could have a thickness of approximately 20 nm.

The electron gas layer 106 forms along the interface of the lower and upper layers 102-104. In a Group III-nitride device, for example, the electron gas layer 106 forms as a result of a difference in polarization charges in the lower and upper layers 102-104. The difference in polarization charges could be due to doping in the upper layer 104, the structure of crystallized materials, or other factors. The electron gas layer 106 here extends between two electrical contacts 108-110 and forms an electrical channel. The electrical contacts 108-110 could represent source and drain contacts associated with a transistor being formed. A gate 112 above the upper layer 104 could represent a gate of the transistor being formed. In some embodiments, the transistor could represent a Group III-V based field effect transistor (FET) or high electron mobility transistor (HEMT).

Each of the electrical contacts 108-110 includes any suitable conductive structure that provides electrical contact with one or more external signal lines or other components. The gate 112 includes any suitable conductive gate structure of a transistor. Each of the electrical contacts 108-110 and the gate 112 could be formed from any suitable material(s), such as titanium, aluminum, nickel, gold, or tungsten. Also, each of the electrical contacts 108-110 and the gate 112 could be formed in any suitable manner, such as by depositing and etching conductive material(s). As particular examples, the gate 112 could be formed by depositing metal or other conductive material(s) directly on the upper layer 104 or on top of an insulating layer 113 formed over the upper layer 104. The material forming the gate 112 could also be deposited on a P-type semiconductor layer formed over the upper layer 104.

As described above, one conventional approach for forming an electrical connection to an electron gas layer includes thinning or removing the upper layer 104 to form recesses for the electrical contacts 108-110. However, this alters the operation of the device, such as by altering the polarization charges capable of accumulating in the layers 102-104, which would weaken or even eliminate the electron gas layer 106 around the electrical contacts 108-110. Another conventional approach involves doping the upper layer 104 via implantation, such as by using silicon. Unfortunately, this approach typically requires the use of high temperatures to active the dopant(s), which can damage the transistor or other device being formed. A third conventional approach involves doping or alloying the upper layer 104 via annealing, such as with a layer of titanium or gold. However, this approach may be problematic when used with barrier layers having a high aluminum content.

In the example shown in FIG. 1, multiple conductive vias 114-116 are formed through the upper layer 104 and into the lower layer 102. The conductive vias 114 electrically couple the electrical contact 108 to the electron gas layer 106. Similarly, the conductive vias 116 electrically couple the electrical contact 110 to the electron gas layer 106. The conductive vias 114-116 can be formed in any suitable manner, such as by etching through the upper layer 104 down into the lower layer 102. The etched openings can then be filled with one or more conductive materials, such as during formation of the electrical contacts 108-110. In particular embodiments, the conductive vias 114-116 could be formed using a surface nano-texturing scheme, such as those used to create surface nano-textures for certain light emitting diodes (LEDs), to form a nano-texture on the electrical contacts 108-110.

Since the upper layer 104 is kept substantially intact, the electron gas layer 106 can be maintained even with the presence of electrical contacts 108-110 in Ohmic contact with the electron gas layer 106. Moreover, the conductive vias 114-116 are in Ohmic contact with the electron gas layer 106 using both vertical transport and enhanced lateral connection. The conductive vias 114-116 contact more of the electron gas layer 106 in the lateral (horizontal) direction, improving their Ohmic contact with the electron gas layer 106. In addition, the conductive material(s) in the conductive vias 114-116 could diffuse laterally in the structure of FIG. 1 during later fabrication steps, increasing the Ohmic contact with the electron gas layer 106.

In this example, the insulating layer 113 is optional, and the gate 112 could be formed directly on the upper layer 104. If used, the insulating layer 113 may be formed over the upper layer 104 before or after the upper layer 104 has been etched. In some embodiments, the insulating layer 113 is formed prior to formation of the conductive vias 114-116, and the insulating layer 113 is etched along with the upper layer 104. Note that while a single integral insulating layer 113 is shown here, the insulating layer 113 could actually include different portions formed at different times. For instance, the insulating layer 113 under the contacts 108-110 could represent portions of a sacrificial dielectric layer, which can be etched away in the space between the contacts 108-110 and replaced with another dielectric layer prior to formation of the gate 112 (assuming the gate 112 is being formed on insulating material). The insulating layer 113 includes any suitable dielectric material(s), such as an aluminum, gallium, or silicon oxide or nitride. The insulating layer 113 could also be formed in any suitable manner.

Although FIG. 1 illustrates a first example of an Ohmic contact scheme 100 for a Group III-V device having a two-dimensional electron gas layer, various changes may be made to FIG. 1. For example, each of the structures in the Ohmic contact scheme 100 could be formed from any suitable material(s) and in any suitable manner. Moreover, each of the structures in the Ohmic contact scheme 100 could have any suitable size, shape, dimensions, and arrangement. In addition, the structure shown in FIG. 1 could be replicated any number of times to produce any number of semiconductor devices.

Figure 2A:
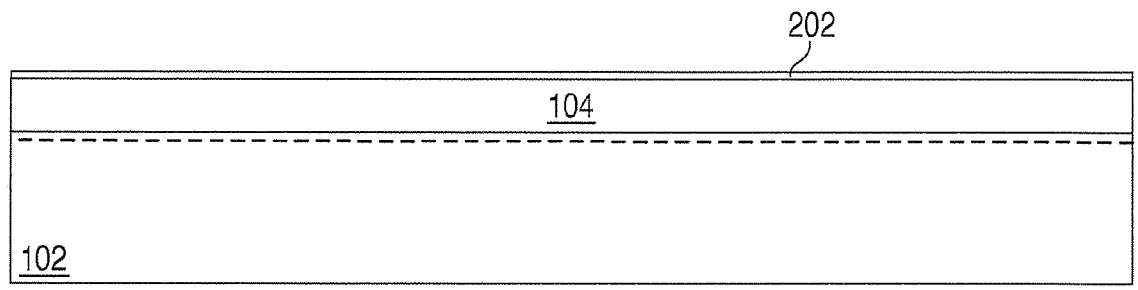
FIGS. 2A through 2E illustrate an example technique for implementing the Ohmic contact scheme of FIG. 1 according to this disclosure.

FIGS. 2A through 2E illustrate an example technique for implementing the Ohmic contact scheme 100 of FIG. 1 according to this disclosure. As shown in FIG. 2A, the technique begins with the lower and upper layers 102-104, which can be formed in any suitable manner. For instance, the lower layer 102 could be formed on a larger substrate, such as an eight-inch or other silicon or other wafer. As a particular example, the lower layer 102 could represent gallium nitride-based buffer and channel layers epitaxially grown on the underlying substrate, and the upper layer 104 could represent an aluminum gallium nitride barrier layer that is epitaxially grown on the lower layer 102. A sacrificial dielectric film 202 is formed over the upper layer 104.

Figure 2B:
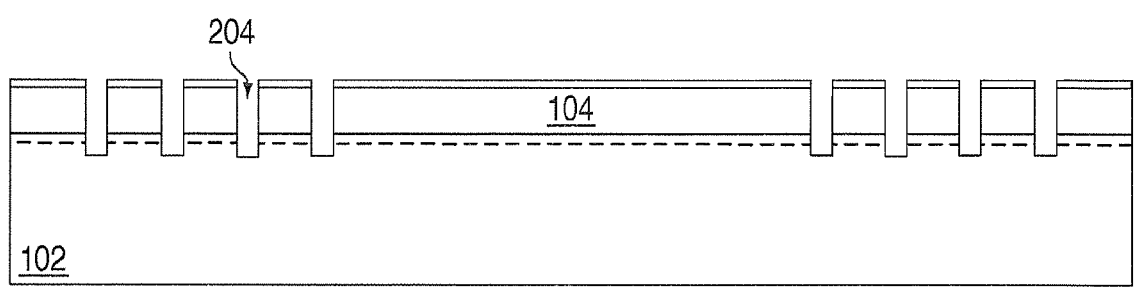

As shown in FIG. 2B, contact holes 204 are formed through the upper layer 104 into the lower layer 102. The contact holes 204 can be formed in any suitable manner. For instance, a layer of photoresist material can be deposited and patterned to form a mask, and the contact holes 204 can be etched using the mask. Note that any other suitable mask could be used.

Figure 2C:
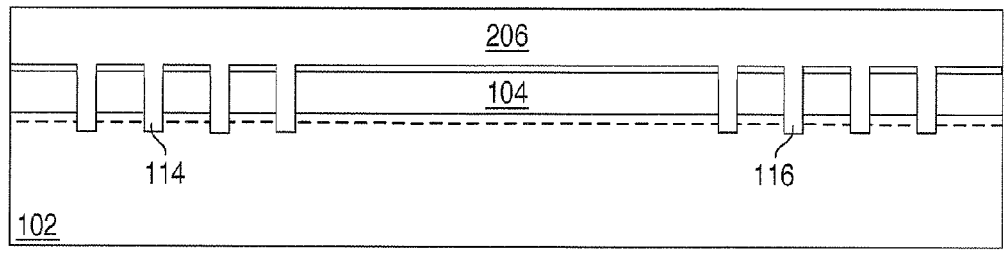

As shown in FIG. 2C, a layer of conductive material 206 is formed over the upper layer 104 and within the contact holes 204. The layer of conductive material 206 could represent titanium or any other conductive material or combination of conductive materials. The layer of conductive material 206 could also be formed in any suitable manner, such as by deposition, masking, and etching. This leads to the creation of the conductive vias 114-116. The upper layer 104 may be protected or capped by an insulating layer (the sacrificial dielectric film 202) during this step.

Figure 2D:
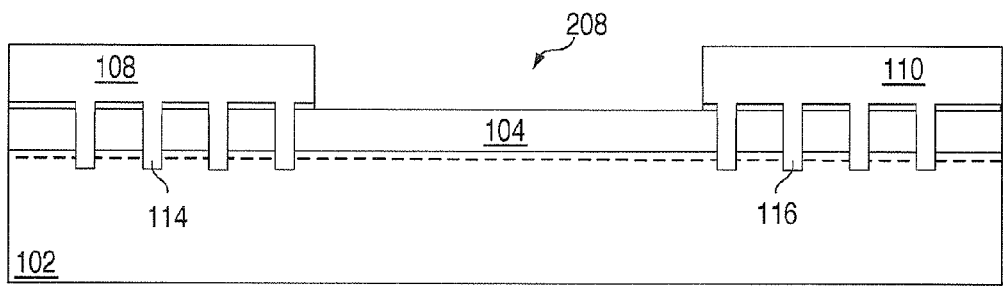

As shown in FIG. 2D, one or more openings 208 are formed in the layer of conductive material 206. The openings 208 could be formed in any suitable manner, such as by etching the layer of conductive material 206 using a mask. The openings 208 divide the layer of conductive material 206 into separate electrical contacts 108-110.

Figure 2E:
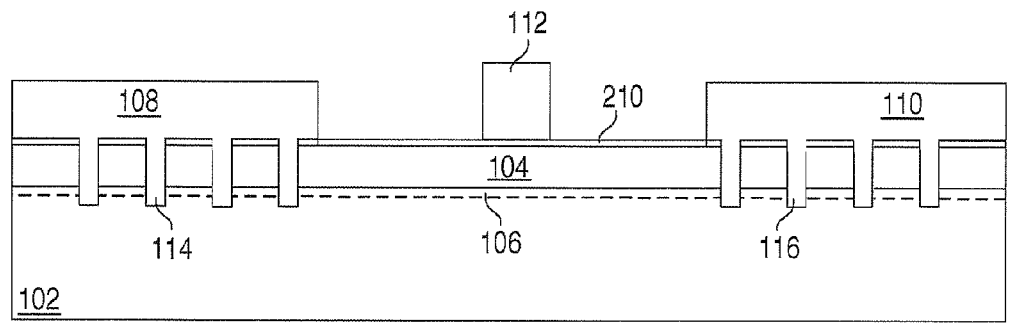

As shown in FIG. 2E, the gate 112 is formed over the upper layer 104 within the opening 208. The gate 112 could be formed in any suitable manner, such as by depositing and etching conductive material. The gate 112 could be formed from any suitable material(s), such as titanium. Note that in FIG. 2D, the sacrificial dielectric film 202 below the opening 208 could also be etched during the formation of the opening 208. If that occurs, an insulating film 210 could be formed within the opening 208 prior to formation of the gate 112. In other embodiments, the gate 112 could be formed directly on the upper layer 104.

After the process shown in FIGS. 2A through 2E, the Ohmic contact scheme 100 has been implemented, where an electron gas layer 106 formed around the interface of the layers 102-104 is electrically contacted using the conductive vias 114-116. This Ohmic contact scheme 100 can therefore be implemented without significantly weakening the electron gas layer 106 or requiring the use of high-temperature dopant activations. Moreover, the Ohmic contact scheme 100 can be implemented using standard complimentary metal oxide semiconductor (CMOS) manufacturing techniques, such as those techniques that operate using eight-inch or other silicon wafers. In addition, the Ohmic contact scheme 100 can provide good contact resistance regardless of the difficulty of alloying through the upper layer 104, and the Ohmic contact scheme 100 works with gold-free electrical contacts 108-110.

Figure 3A:
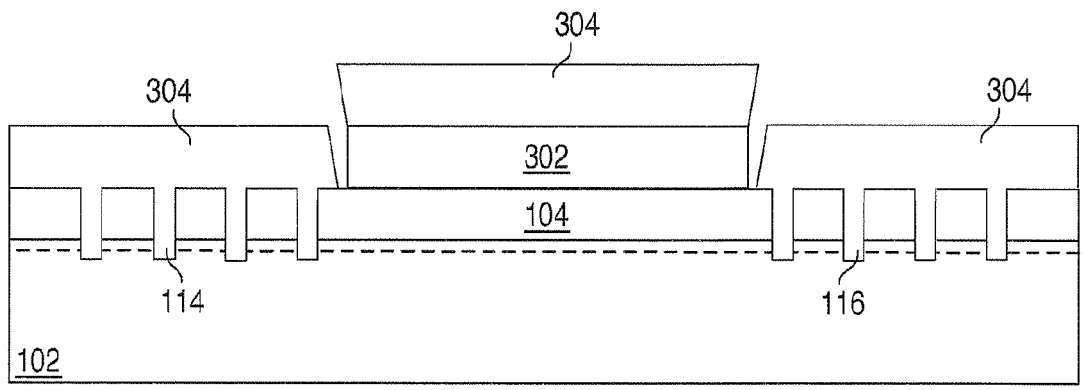
FIGS. 3A and 3B illustrate another example technique for implementing the Ohmic contact scheme of FIG. 1 according to this disclosure.
Figure 3B:
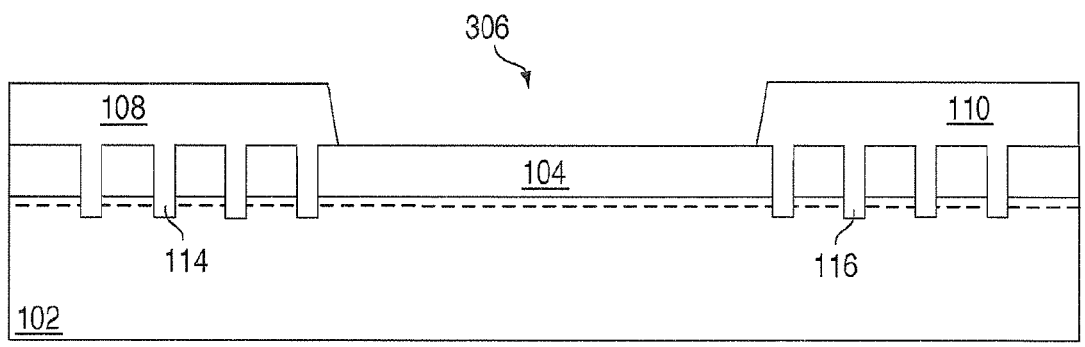

FIGS. 3A and 3B illustrate another example technique for implementing the Ohmic contact scheme 100 of FIG. 1 according to this disclosure. In particular, FIGS. 3A and 3B illustrate steps that may replace the steps shown in FIGS. 2C and 2D.

As shown in FIG. 3A, the insulating layer 113 has been omitted in the Ohmic contact scheme, and a mask 302 is formed over the upper layer 104 prior to deposition of a conductive layer 304. The mask 302 could be formed in any suitable manner and from any suitable material(s), such as a photoresist material. The mask 302 is formed in an area where an opening through the conductive layer 304 is to be located. The conductive layer 304 is then deposited, and the conductive layer 304 fills the contact holes 204 and creates the conductive vias 114-116. However, the conductive layer 304 is spaced apart from a portion of the upper layer 104 by the mask 302. As shown in FIG. 3B, the mask 302 can be dissolved, which lifts the portion of the conductive layer 304 that is above the mask 302. This implements a "liftoff" technique, which leaves an opening 306 in the conductive layer 304. At this point, the electrical contacts 108-110 have been formed, and optional insulating material and the gate 112 could be formed within the opening 306.

Although FIGS. 2A through 3B illustrate examples of techniques for implementing the Ohmic contact scheme 100 of FIG. 1, various changes may be made to FIGS. 2A through 3B. For example, the structures in the Ohmic contact scheme 100 could have any suitable sizes, shapes, dimensions, and arrangements. Also, each of the structures in the Ohmic contact scheme 100 could be formed in any suitable manner and in any suitable order.

Figure 4:
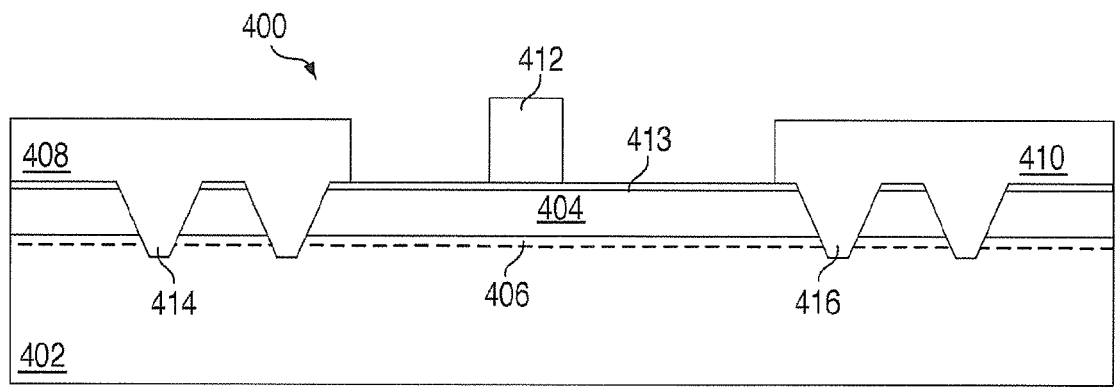
FIG. 4 illustrates a second example Ohmic contact scheme for a Group III-V device having a two-dimensional electron gas layer according to this disclosure.

FIG. 4 illustrates a second example Ohmic contact scheme 400 for a Group III-V device having a two-dimensional electron gas layer according to this disclosure. As shown in FIG. 4, the Ohmic contact scheme 400 is implemented using a structure that includes at least one lower layer 402 and at least one upper layer 404, which create a two-dimensional electron gas layer 406. Also, electrical contacts 408-410 and a gate 412 are formed over the upper layer 404. An optional insulating layer 413 could be formed over the upper layer 404. These components 402-413 may be the same as or similar to the corresponding components 102-113 in FIG. 1.

The electrical contacts 408-410 are in Ohmic contact with the electron gas layer 406 using multiple conductive vias 414-416. In this embodiment, however, the conductive vias 414-416 have sloped sidewalls, rather than substantially vertical sidewalls as in FIG. 1. The sloped sidewalls provide regions where enhanced vertical contact is made with the electron gas layer 406. In situations where the combination of the upper layer's thickness and the electron gas layer's thickness are optimized, this approach can help to reduce sensitivity to etch depth variations, particularly when compared to the case of etching one large contact opening with an optimized etch depth.

Although FIG. 4 illustrates a second example of an Ohmic contact scheme 400 for a Group III-V device having a two-dimensional electron gas layer, various changes may be made to FIG. 4. For example, each of the structures in the Ohmic contact scheme 400 could be formed from any suitable material(s) and in any suitable manner. Moreover, each of the structures in the Ohmic contact scheme 400 could have any suitable size, shape, dimensions, and arrangement. In addition, the structure shown in FIG. 4 could be replicated any number of times to produce any number of semiconductor devices.

Figure 5A:
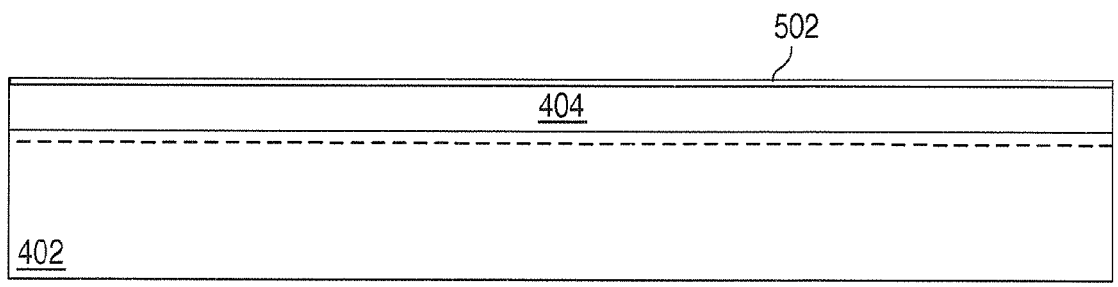
FIGS. 5A through 5E illustrate an example technique for implementing the Ohmic contact scheme of FIG. 4 according to this disclosure.

FIGS. 5A through 5E illustrate an example technique for implementing the Ohmic contact scheme 400 of FIG. 4 according to this disclosure. As shown in FIG. 5A, the technique begins with the layers 402-404, which can be formed in any suitable manner, such as by forming epitaxial Group III-nitride layers or other Group III-V layers. A sacrificial dielectric film 502 is formed over the upper layer 404.

Figure 5B:
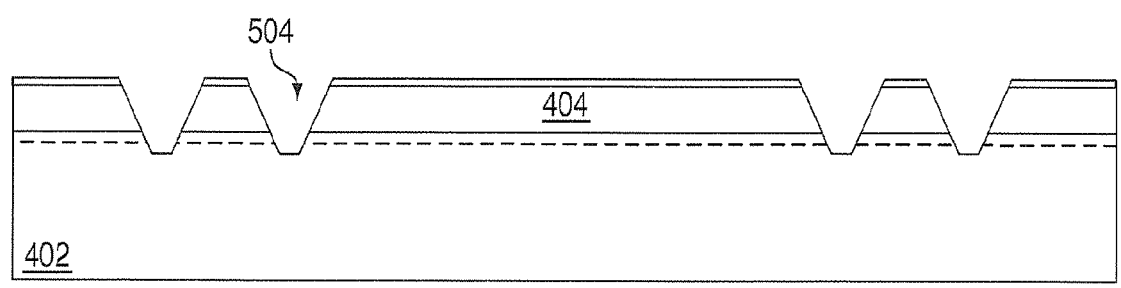

As shown in FIG. 5B, contact holes 504 are formed through the upper layer 404 into the lower layer 402, such as by etching the contact holes 504 through the upper layer 404. The sloped sidewalls can be achieved in any suitable manner, such as by the use of a photoresist mask that erodes (becomes smaller in size) as an etch proceeds.

Figure 5C:
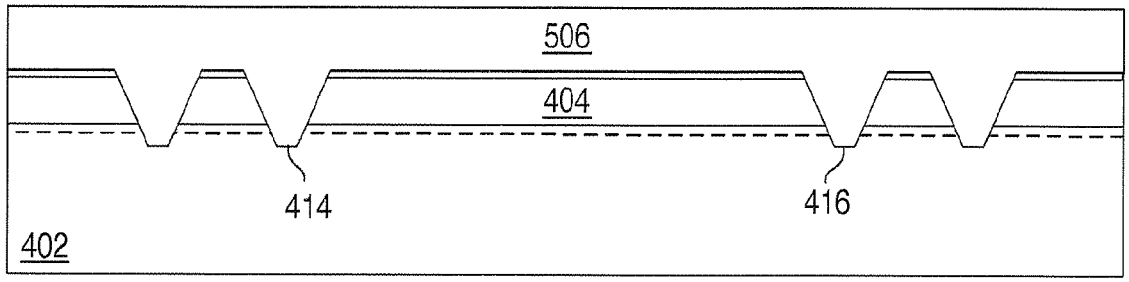
Figure 5D:
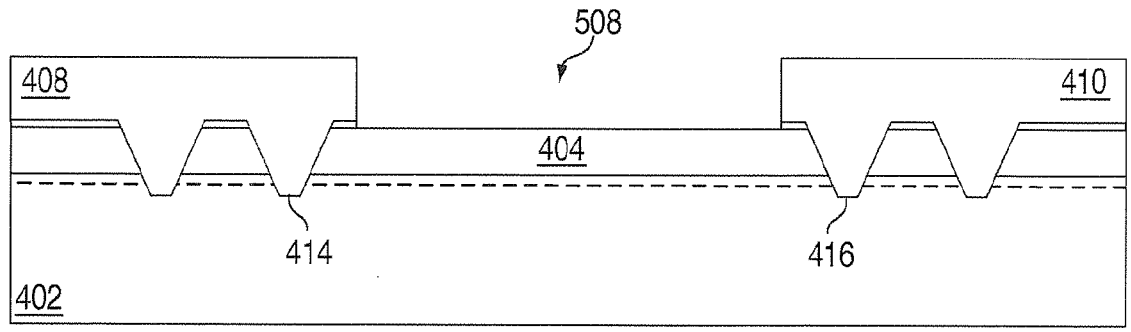

As shown in FIG. 5C, a layer of conductive material 506 is formed over the upper layer 404 and within the contact holes 504, creating the conductive vias 414-416. As shown in FIG. 5D, one or more openings 508 are formed in the layer of conductive material 506, such as by etching the layer of conductive material 506 using a mask, to form the electrical contacts 408-410.

Figure 5E:
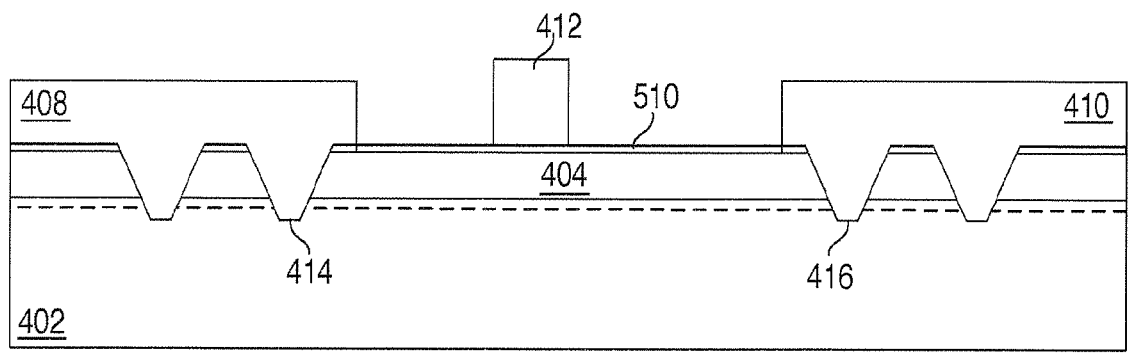

As shown in FIG. 5E, the gate 412 is formed over the upper layer 404, such as by depositing and etching conductive material. In FIG. 5D, the sacrificial dielectric film 502 below the opening 508 could also be etched during the formation of the opening 508. If that occurs, an insulating film 510 could be formed prior to formation of the gate 412. In other embodiments, the gate 412 could be formed directly on the upper layer 404.

After the process shown in FIGS. 5A through 5E, an Ohmic contact scheme 400 is implemented. The Ohmic contact scheme 400 can have many or all of the benefits described above with respect to the Ohmic contact scheme 100.

Although FIGS. 5A through 5E illustrate one example of a technique for implementing the Ohmic contact scheme 400 of FIG. 4, various changes may be made to FIGS. 5A through 5E. For example, the structures in the Ohmic contact scheme 400 could have any suitable sizes, shapes, dimensions, and arrangements. Also, each of the structures in the Ohmic contact scheme 400 could be formed in any suitable manner and in any suitable order. In particular embodiments, the conductive vias 414-416 could be formed as surface nano-texturing for the electrical contacts 408-410. In addition, the liftoff technique described above with respect to FIGS. 3A and 3B could be used in place of the steps shown in FIGS. 5C and 5D.

Figure 6A:
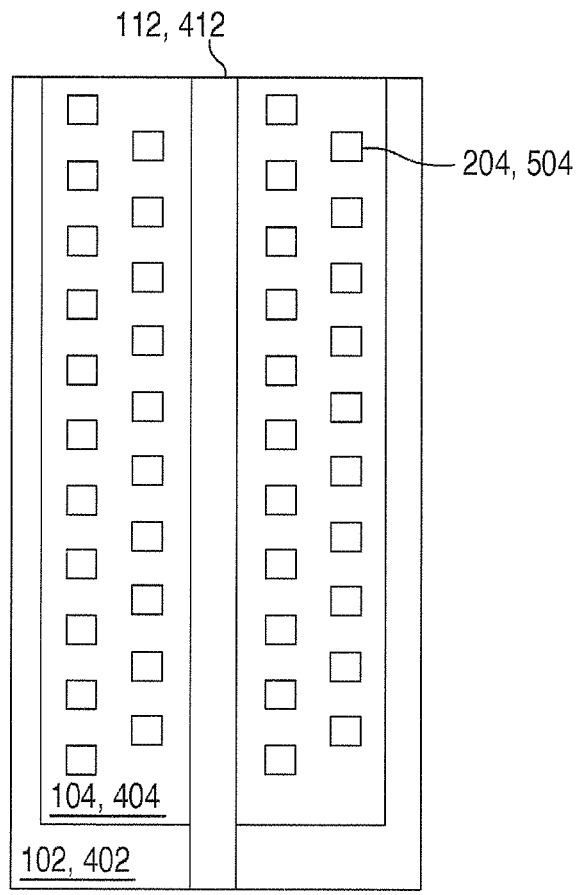
FIGS. 6A and 6B illustrate example etch patterns used to implement the Ohmic contact schemes of FIGS. 1 and 4 according to this disclosure.
Figure 6B:
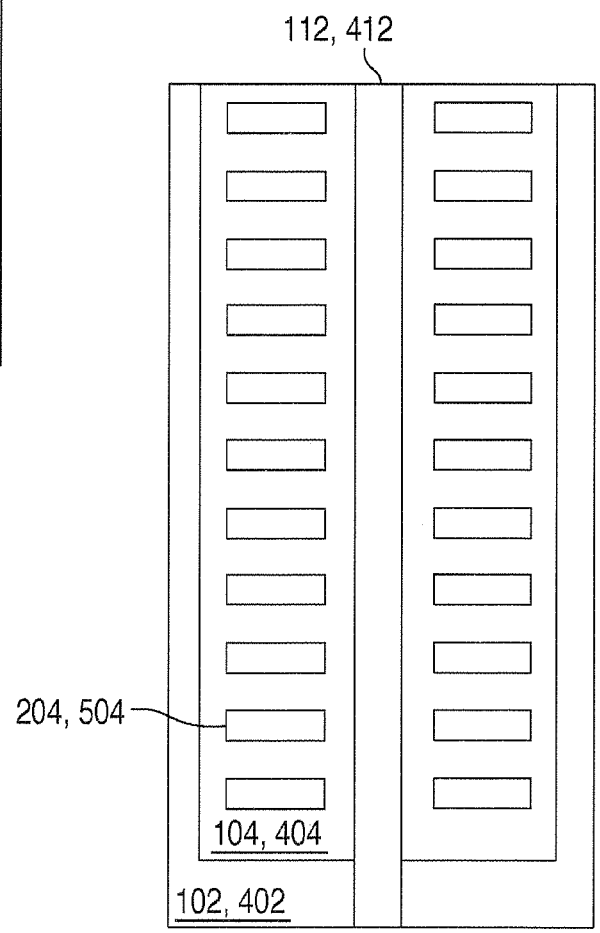

FIGS. 6A and 6B illustrate example etch patterns used to implement the Ohmic contact schemes of FIGS. 1 and 4 according to this disclosure. In particular, FIGS. 6A and 6B illustrate top views of the structures implementing the Ohmic contact schemes of FIGS. 1 and 4, without the electrical contacts 108-110 or 408-410. As shown in FIG. 6A, the gate 112 or 412 is over the upper layer 104 or 404, and various contact holes 204 or 504 have been formed through the upper layer. The contact holes could be filled with conductive material(s) to form the conductive vias 114-116 or 414-416, either during the same operation used to deposit conductive material(s) for the electrical contacts 108-110 or 408 -410 or during a separate operation.

The contact holes 204 or 504 could have any suitable size, shape, and dimensions. In this example, the contact holes 204 or 504 are square, although the contact holes could be circular, rectangular, or other shape(s). Also, the contact holes 204 or 504 could have a diameter of 0.22 μm, 0.5 μm, or other suitable size. In addition, while shown as including four rows of contact holes 204 or 504, the contact holes could have any suitable random or periodic arrangement. The maximum edge contact could be achieved with the minimum-pitch geometry allowed by the technology.

As shown in FIG. 6B, various contact holes 204 or 504 have been formed through the upper layer 104 or 404. Again, the contact holes 204 or 504 could be filled with conductive material(s), either during the same operation used to form the electrical contacts or during a separate operation. In this example, the contact holes 204 or 504 represents grooves or slots having an elongated form compared to the contact holes in FIG. 6A. The contact holes 204 or 504 can be formed in any suitable manner, such as by etching the upper layer 104 or 404.

By providing various smaller and more numerous electrical paths through the upper layer 104 or 404 to an electron gas layer 106 or 406, Ohmic contact with the electron gas layer is achieved. This approach avoids problems associated with significantly altering the polarization charges or other characteristics of the layers 102-104 or 402-404. This approach also avoids problems associated with high temperature activations of dopants, as well as problems associated with the use of high aluminum concentrations in the upper layer.

Although FIGS. 6A and 6B illustrate examples of the etch patterns used to implement the Ohmic contact schemes of FIGS. 1 and 4, various changes may be made to FIGS. 6A and 6B. For example, any other suitable etch pattern(s) could be used to form electrical connections through an upper layer to an electron gas layer.

Figure 7:
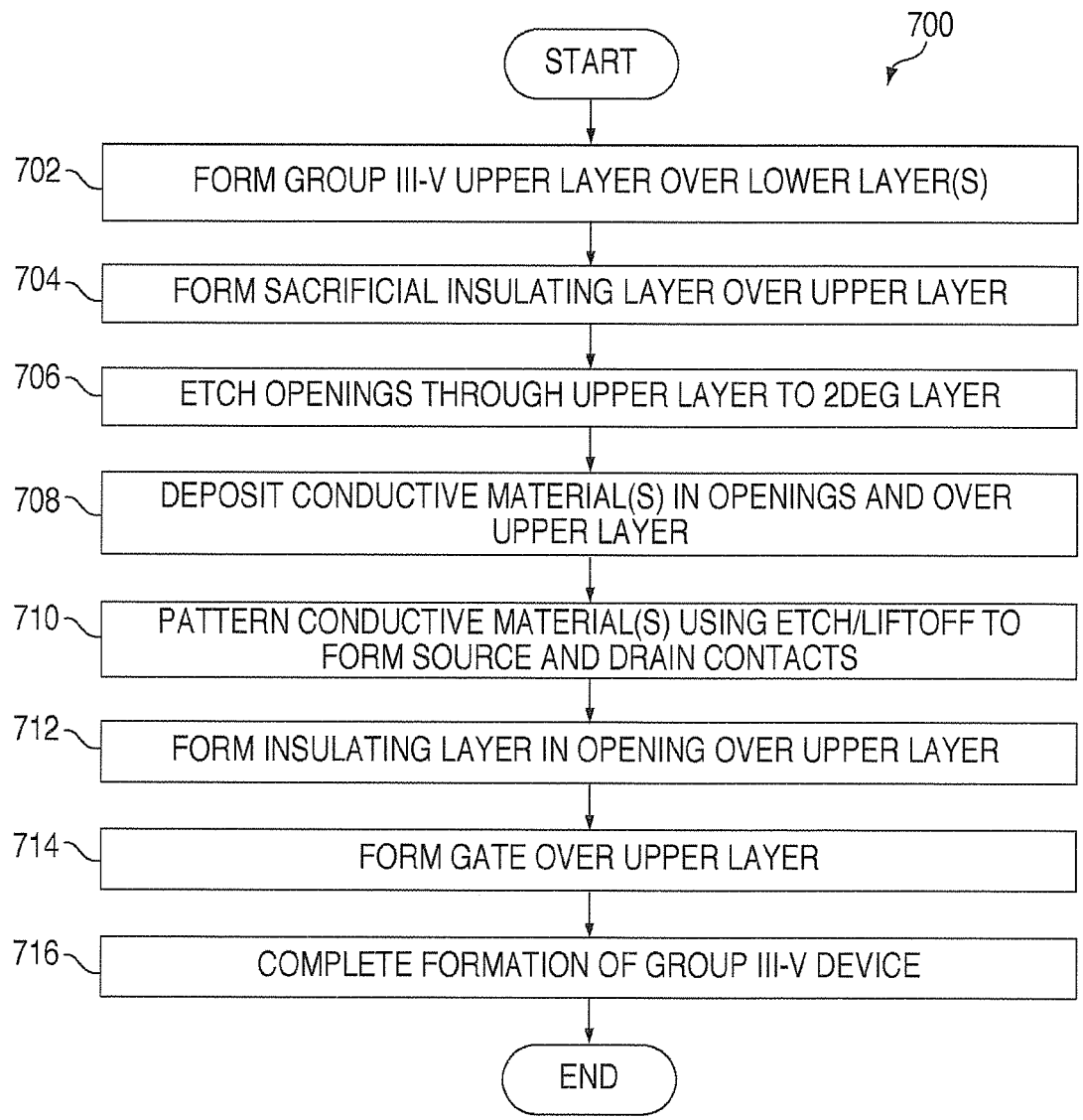
FIG. 7 illustrates an example method for implementing an Ohmic contact scheme for a Group III-V device having a two-dimensional electron gas layer according to this disclosure.

FIG. 7 illustrates an example method 700 for implementing an Ohmic contact scheme for a Group III-V device having a two-dimensional electron gas layer according to this disclosure. In FIG. 7, the Group III-V device may be described as being a Group III-nitride device. However, similar steps could be used to implement an Ohmic contact scheme for any other suitable device having an electron gas layer.

At least one Group III-V upper layer is formed over at least one Group III-V lower layer at step 702. This could include, for example, forming an epitaxial aluminum gallium nitride barrier layer over an aluminum nitride nucleation layer, an aluminum gallium nitride buffer layer, and a gallium nitride channel layer. The layers can form a polarization-induced channel, such as between a source and a drain of a Group III-nitride FET or HEMT being fabricated. A sacrificial insulating layer can optionally be formed over the upper layer at step 704.

Multiple openings are etched through the upper layer down to a two-dimensional electron gas layer at step 706, and one or more conductive materials are deposited in the openings and over the upper layer at step 708. This could include, for example, etching contact holes 204 or 504 having square, slotted, or other shape(s). This could also include depositing titanium or other material(s) into the contact holes 204 or 504 to produce conductive vias 114-116 or 414-416. This could further include forming the conductive vias using nano-texturing or other suitable technique.

The one or more conductive materials are patterned, such as by etching or liftoff, to form source and drain electrical contacts at step 710. This could include, for example, etching the conductive material(s) to form separate electrical contacts 108-110 or 408-410. An anneal could occur at this point, such as an anneal at a temperature of at least 300° C.

A gate is formed in an opening over the upper layer at step 714. This could include, for example, depositing and etching conductive material(s) to form the gate 112 or 412. The gate can be formed within an opening 208 or 508 between the electrical contacts previously formed. Formation of a Group III-V device is largely completed (without passivation or back-end processing) at step 716. This could include, for example, forming a source and a drain of a Group III-nitride FET or HEMT.

Although FIG. 7 illustrates one example of a method for implementing an Ohmic contact scheme for a Group III-V device having a two-dimensional electron gas layer, various changes may be made to FIG. 7. For example, while shown as a series of steps, various steps in FIG. 7 could overlap, occur in parallel, occur in a different order, or occur multiple times.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A semiconductor device having an ohmic contact structure for contacting directly to a two-dimensional electron gas layer comprising:
   a first layer and a second layer over the first layer, the first and second layers configured to form an electron gas layer at an interface of the first and second layers;
   wherein the first layer comprises Group III-nitride nucleation, buffer, and channel layers;

and also wherein the second layer comprises a Group III-nitride barrier layer;

two Ohmic contacts;

two groups of multiple conductive vias formed through the second layer, each group of conductive vias connected to the two-dimensional electron gas layer and configured to electrically couple the Ohmic contacts to the two-dimensional electron gas layer, wherein each via of each group of conductive vias is configured to have a nano-texture surface forming electrical contact with the two-dimensional electron gas layer at the interface of the first and second layer.

2. The semiconductor device of claim 1, wherein the two-dimensional electron gas layer forms a two-dimensional electron gas channel between the Ohmic contacts.

3. The semiconductor device of claim 2, wherein the Ohmic contacts comprise source and drain contacts.

4. The semiconductor device of claim 1, wherein the conductive vias comprise vias having substantially vertical sidewalls.

5. The semiconductor device of claim 1, wherein the conductive vias comprise vias having substantially sloped sidewalls.

6. The semiconductor device of claim 1, wherein:
the first layer comprises a gallium nitride or aluminum gallium nitride buffer layer; and
the second layer comprises an aluminum gallium nitride barrier layer.

7. A system comprising:
multiple semiconductor devices, having ohmic contact structures for contacting directly to a two-dimensional electron gas layer, each semiconductor device comprising:
a first layer and a second layer over the first layer, the first and second layers configured to form an electron gas layer at an interface of the first and second layers;
wherein the first layer comprises Group III-nitride nucleation, buffer, and channel layers;
and also wherein the second layer comprises a Group III-nitride barrier layer;
two Ohmic contacts;
two groups of multiple conductive vias formed through the second layer, each group of conductive vias connected to the two-dimensional electron gas layer and configured to electrically couple the Ohmic contacts to the two-dimensional electron gas layer, wherein each via of each group of conductive vias is configured to have a nano-texture surface forming electrical contact with the two-dimensional electron gas layer at the interface of the first and second layer.

8. The system of claim 7, wherein the two-dimensional electron gas layer in each semiconductor device forms a two-dimensional electron gas channel between the Ohmic contacts of that semiconductor device.

9. The system of claim 8, wherein the Ohmic contacts in each semiconductor device comprise source and drain contacts.

10. The system of claim 7, wherein the conductive vias comprise vias having substantially vertical sidewalls.

11. The system of claim 7, wherein the conductive vias comprise vias having substantially sloped sidewalls.

12. The system of claim 7, wherein:
the first layer comprises a gallium nitride or aluminum gallium nitride buffer layer; and
the second layer comprises an aluminum gallium nitride barrier layer.

* * * * *